United States Patent [19]
Major

[11] Patent Number: 5,329,252
[45] Date of Patent: Jul. 12, 1994

[54] SLEW-RATE LIMITED VOLTAGE CONTROLLED OSCILLATOR CONTROL VOLTAGE CLAMP CIRCUIT

[75] Inventor: Claude L. Major, Gloucester, Canada

[73] Assignee: Northern Telecom Limited, Montreal, Canada

[21] Appl. No.: 980,378

[22] Filed: Nov. 5, 1992

[51] Int. Cl.$^5$ .................. H03L 7/08; H03L 7/085; H03L 7/14

[52] U.S. Cl. .................. 331/15; 331/14; 331/17

[58] Field of Search ............... 331/8, 14, 15, 17, 18, 331/25, DIG. 2, 2

[56] References Cited

U.S. PATENT DOCUMENTS 5,065,115 11/1991 Pletz-Kirsch et al. ............... 331/14

Primary Examiner—David Mis
Attorney, Agent, or Firm—Dallas F. Smith

[57] ABSTRACT

A clamp circuit for use in a phase-locked loop clock circuit, the phase-locked loop including a phase detector with inputs for reference clock signal and oscillator signal, a loop filter with an input connected to the phase detector, and a voltage-controlled oscillator with an output connected to the phase detector, the clamping circuit connected between an output of the loop filter and an input of the voltage-controlled oscillator, the clamping circuit connected between the loop filter and the voltage-controlled oscillator. The clamping circuit selectively provides, under the control of a clamping signal either a path for the loop through the clamping circuit or clamping the input of the voltage-controlled oscillator to varying potential. The varying potential is provided by a resistor capacitor network. When the loop is closed the capacitor is charged to an average of the loop control voltage for the oscillator. In response to the clamping signal the capacitor is connected to ground, thereby providing an RC time constant varying potential which allows the oscillator to be clamped to a fixed voltage in a slew-rate controlled manner.

16 Claims, 1 Drawing Sheet

SLEW-RATE LIMITED VOLTAGE CONTROLLED OSCILLATOR CONTROL VOLTAGE CLAMP CIRCUIT

This invention relates to voltage-controlled oscillator clamp circuits and is particularly concerned with clamp circuits that are slew-rate limited in the clamping action.

BACKGROUND OF THE INVENTION

Multiple line access to digital telecommunications equipment necessitates its organization into groupings of similar circuit packs, for example into shelves of receivers and transmitters. Typically, clock signals needed by the individual transmitters are provided by a single transmitter designated as a master, with respect to clocking, and the remaining transmitters being slaved from the master. Each transmitter also typically has a local clock circuit comprising for example, a voltage-controlled crystal oscillator (VCXO). The master transmitter could either phase-lock to a standard clock signal or use its internal VCXO. Transition between the reference clock signal and the internal VCXO is typically achieved using a clamping circuit which clamps the VCXO to a preset reference voltage representing a desired free-running frequency for the VCXO. An individual circuit pack may be able to tolerate the phase shift introduced by the clamping action, however when several circuit packs are slaved to a master circuit pack for clocking, rapid phase shifts may cause problems. It is desirable to limit the rate at which the master circuit pack changes its frequency.

SUMMARY OF THE INVENTION

An object of the present invention is to provide an improved voltage-controlled oscillator clamping circuit.

In accordance with another aspect of the present invention there is provided a clamp circuit for use in a phase-locked loop clock circuit, the phase-locked loop including a phase detector with inputs for reference clock signal and oscillator signal, a loop filter with an input connected to the phase detector, and a voltage-controlled oscillator with an output connected to the phase detector, the clamping circuit connected between an output of the loop filter and an input of the voltage-controlled oscillator, said clamping circuit including: a bypass circuit for connecting the loop filter to the input of the voltage-controlled oscillator; resistor-capacitor time constant means for providing a time constant varying potential; first clamping means for clamping the input of the voltage-controlled oscillator to the time constant varying potential; and control means, responsive to a clamping signal for selectively disabling the bypass circuit and enabling the first clamping means; whereby the resistor-capacitor time constant means slew-rate controls the potential applied to the voltage-controlled oscillator.

In accordance with another aspect of the present invention there is provided a clock circuit comprising an input terminal for receiving a reference clock signal, an output terminal for providing a clock signal; and a phase-locked loop; said phase-locked loop including: a phase detector having two inputs, one connected to the input terminal, and an output, a loop filter having an input connected to the output of the phase detector and having an output, a clamping circuit having a first input connected to the output of the loop filter, a second input for receiving a clamping signal, and an output, and a voltage-controlled oscillator having an input connected to the output of the clamp circuit and an output connected to the output terminal and the other input of the phase detector; said clamping circuit including: a bypass circuit for connecting the output of the loop filter to the input of the voltage-controlled oscillator, resistor-capacitor time constant means for providing a time constant varying potential, first clamping means for clamping the input of the voltage-controlled oscillator to the time constant varying potential, and control means, responsive to a clamping signal for selectively disabling the bypass circuit and enabling the first clamping means and whereby the resistor capacitor time constant means slew-rate controls the potential applied to the voltage-controlled oscillator.

In an embodiment of the present invention the clamp circuit further comprising a second clamping means for clamping the output of the loop filter to a reference potential.

Conveniently, the control means comprise first and second comparators, each having one input connected to a reference potential and the other input connected to the second input of the clamping circuit, and an analog multiplexer, having an input connected to the second input of the clamping circuit.

Conveniently, the time constant means comprises a capacitor and a voltage follower connected to the first clamping means and a resistor selectively connected between the capacitor and ground via the analog multiplexer, for providing a time constant varying potential thereto.

An advantage of the present invention is providing a slew-rate limited potential when clamping the controlled oscillator for free-running operation, thereby avoiding sudden phase or frequency shifts.

BRIEF DESCRIPTION OF THE DRAWINGS

The present invention will be further understood from the following description with reference to the drawings in which.

Similar references are used in different Figures to denote similar components.

DETAILED DESCRIPTION

Figure 1:
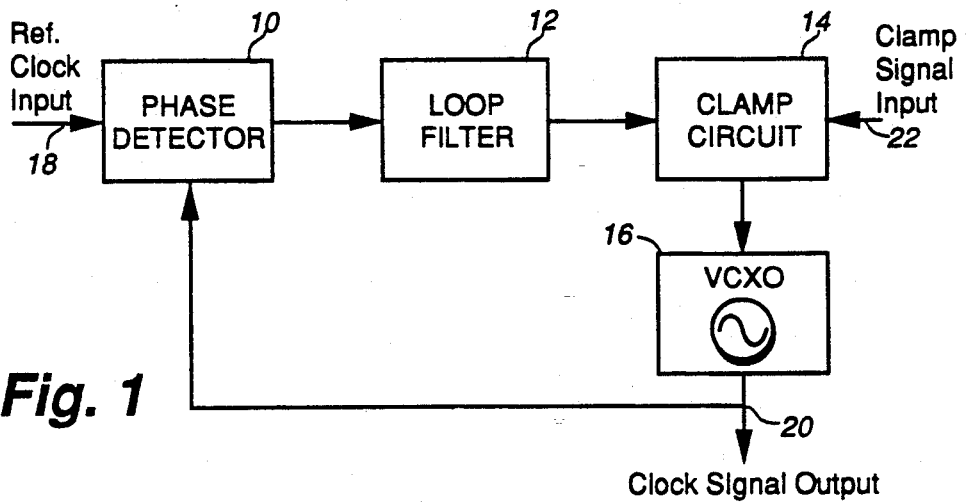
FIG. 1 illustrates a phase-locked loop circuit in accordance with an embodiment of the present invention.

Referring to FIG. 1, there is illustrated a phase-locked loop circuit in accordance with an embodiment of the present invention. The phase-locked loop includes a phase detector 10, a loop filter 12, a slew-rate limited clamp circuit 14, and a voltage-controlled oscillator (VCXO) 16 serially connected in a loop. The phase detector has an input 18 for a reference signal. The VCXO has an output 20 for a clock signal. The clamp circuit 14 has an input 22 for a clamp signal.

In operation, when a clamp signal is not asserted, the phase-locked loop is in a closed state and matches the frequency of the VCXO 16 to that of the reference signal applied to the input 18, in a known manner, by comparing the phase of the VCXO 16 output to the reference signal using the phase detector 10. The phase detector 10 provides a voltage signal which is filtered, to remove any noise component outside the bandwidth of the phase-locked loop, by the loop filter 12, to produce a control voltage $v_c$, the control voltage $v_c$ is then applied to the VCXO 16. In this case, the clamp circuit 14 is internally bypassed.

When a clamp signal is asserted, the clamp circuit opens the loop, thereby removing the control voltage $v_c$ from the VCXO, and applies a predetermined, fixed voltage $v_f$ to the VCXO. As a result the VCXO acts as a free-running, fixed-frequency oscillator. Depending upon the difference in frequency between the fixed-frequency and the reference frequency, a relatively large frequency or phase step could occur on assertion of the clamp signal. As a relatively large step may cause problems, it is desirable to limit the slew-rate of the change between the control voltage $v_c$ and the fixed voltage $v_f$. Thus, the clamp circuit 14 includes slew-rate control as described in further detail hereinbelow.

Figure 2:
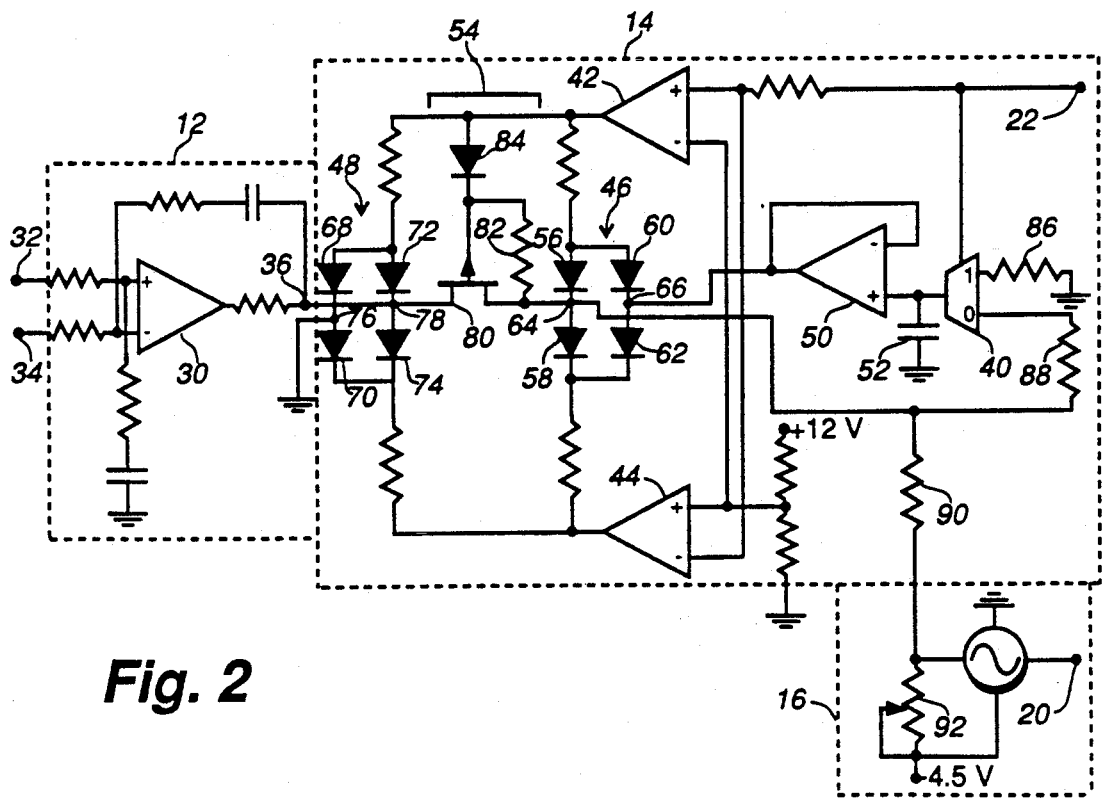
FIG. 2 schematically illustrates the loop filter, slew-rate limited clamp circuit and voltage-controlled oscillator of FIG. 1.

Referring to FIG. 2, there is schematically illustrated the loop filter, slew-rate limited clamp circuit and voltage-controlled crystal oscillator of FIG. 1. The loop filter 12 includes an operational amplifier 30 having noninverting and inverting inputs coupled to inputs 32 and 34, respectively, and an output 36. The clamp circuit 14 includes an analog MUX 40, comparators 42 and 44, diode networks 46 and 48, a voltage follower 50, a capacitor 52, and bypass circuit 54. The clamp signal input 22 is connected to the select input of analog MUX 40, the noninverting input of comparator 42 and the inverting input of comparator 44. The noninverting input of comparator 44 and the inverting input of comparator 42 are connected to a positive TTL reference voltage $V_{ref}$. Outputs of comparator 42 and comparator 44 are coupled to anode and cathode ends, respectively, of diode networks 46 and 48.

The diode network 46 includes four diodes 56, 58, 60 and 62, series connected in pairs and in the same orientation, to form two parallel paths, one being diodes 56 and 58 with a node 64 therebetween, the other being diodes 60 and 62 with a node 66 therebetween. Similarly, the diode network 48 includes four diodes 68, 70, 72 and 74, series connected in pairs and in the same orientation, to form two parallel paths, one being diodes 68 and 70 with a node 76 therebetween, the other being diodes 72 and 74 with a node 78 therebetween. The nodes 64, 66, 76 and 78 are connected to the VCXO 16, the output of voltage follower 50, ground, and the output of the loop filter 12, respectively.

Inputs of analog MUX 40 are coupled to ground and the node 64 via resistors 86 and 88, respectively. The output of analog MUX 40 is connected to the input of voltage follower 50, which is capacitively coupled to ground via the capacitor 52. The bypass circuit 54 includes a J-FET 80, a biassing resistor 82, and a diode 84. The diode 84 has its anode connected to the output of comparator 42 and its cathode connected to the gate of J-FET 80. Drain and source terminals of J-FET 80 are connected to node 78 and 64, respectively.

The VCXO input includes a resistor 90 connected to the input of the VCXO and a variable resistor 92 coupled to a −4.5 V supply.

In operation, when no clamp signal is asserted at the input 22, that is TTL logic '0' is present, the comparator 42 has an output, negative supply voltage and the comparator 44 has an output, positive supply voltage. Hence, the diode networks 46 and 48 are reversed biassed. In this state, a current flows through the biassing resistor 82 to the −4.5 V supply connected to the variable resistor 92, thereby turning the J-FET 80 'ON'. Thus, the clamping circuit is bypassed and the phase-locked loop is closed. In this state, the analog MUX 40 connects the capacitor 52, via the resistor 88, to the node 64 thereby causing the capacitor 52 to be charged to an average of the control voltage of the loop $v_c$.

When a logic '1' TTL clamp signal is asserted at the input 22, the outputs of comparators 42 and 44 become saturated to the positive supply voltage and the negative supply voltage, respectively. The diode networks 46 and 48 are thereby forward biassed, causing the potential to be the same at nodes 64 and 66 and at nodes 76 and 78. The output of comparator 42 via the diode 84 makes the voltage at the gate of J-FET 80 more positive than the source of J-FET 80, thereby turning the J-FET 80 'OFF'. This opens the phase-locked loop. The logic '1' TTL clamp signal is also applied to the select input of analog MUX 40, which in response thereto connects the capacitor 52 to ground via the resistor 86. The time constant $R_{86}C_{52}$ sets the slew-rate of the voltage to which the VCXO is clamped in the following manner. The voltage follower 50 holds the node 66 at the voltage on the capacitor 52, and as the voltage drops across diodes 60 and 56 are the same, the same voltage appears at the node 64, which is connected to the input of VCXO 16 via the resistor 90. As the capacitor 52 discharges, the voltage controlling the VCXO drops until the fixed voltage $v_f$, set by the variable resistor 92, is reached. Subsequently, the VCXO operates as a free-running fixed-frequency oscillator as long as the clamp signal remains at a TTL logic '1'. The capacitor 52 continues to discharge approaching ground potential.

When the clamp signal returns to a TTL logic '0', the diode networks 46 and 48 are reverse biased, the J-FET 80 is turned 'ON', and the analog MUX is switched so that the output of the loop filter 12 is applied to the capacitor 52. The loop filter integrates from ground potential to a new control voltage at a rate set by the loop parameters.

Numerous modifications, variations and adaptations may be made to the particular embodiments of the invention described above without departing from the scope of the invention, which is defined in the claims.

What is claimed is:

1. A clamp circuit for use in a phase-locked loop clock circuit, the phase-locked loop including a phase detector with inputs for reference clock signal and oscillator signal, a loop filter with an input connected to the phase detector, and a voltage-controlled oscillator with an output connected to the phase detector, the clamping circuit connected between an output of the loop filter and an input of the voltage-controlled oscillator, said clamping circuit including:

a bypass circuit for connecting the loop filter to the input of the voltage-controlled oscillator;

resistor-capacitor time constant means for providing a time constant varying potential;

first clamping means for clamping the input of the voltage-controlled oscillator to the time constant varying potential; and control means, responsive to a clamping signal for selectively disabling the bypass circuit and enabling the first clamping means;

whereby the resistor-capacitor time constant means slew-rate controls the potential applied to the voltage-controlled oscillator.

2. A clamp circuit as claimed in claim 1 further comprising a second clamping means for clamping the output of the loop filter to a reference potential.

3. A clamp circuit as claimed in claim 2 wherein the control means comprise first and second comparators, each having one input connected to a reference potential and the other input connected to the second input of the clamping circuit, and an analog multiplexer, having an input connected to the second input of the clamping circuit.

4. A clamp circuit as claimed in claim 3 wherein first and second comparators have outputs connected to first and second clamping means and the bypass circuit for enabling first and second clamping means and for disabling the bypass circuit, respectively, in response to the clamping signal.

5. A clamp circuit as claimed in claim 4 wherein the resistor-capacitor time constant means comprises a capacitor and a voltage follower connected to the first clamping means and a resistor selectively connected between the capacitor and ground via the analog multiplexer, for providing a time constant varying potential thereto.

6. A clamp circuit as claimed in claim 5 wherein the first clamping means includes a diode network having two parallel branches of two series-connected diodes, having the output of the voltage follower connected to one branch between the diodes, and the input to the voltage-controlled oscillator connected to the other branch between the diodes.

7. A clamp circuit as claimed in claim 6 wherein the second clamping means includes a diode network having two parallel branches of two series-connected diodes, having the output of the loop filter connected to one branch between the diodes, and the reference potential to the other branch between the diodes.

8. A clamp circuit as claimed in claim 7 wherein the bypass circuit includes a field-effect transistor having gate, drain and source inputs, a diode connected between the output of the first comparator and the gate input, and a biassing resistor connected between gate and source inputs of the field-effect transistor.

9. A clock circuit comprising:
an input terminal for receiving a reference clock signal;
an output terminal for providing a clock signal; and
a phase-locked loop;
said phase-locked loop including:
a phase detector having two inputs, one connected to the input terminal, and an output,
a loop filter having an input connected to the output of the phase detector and having an output,
a clamping circuit having a first input connected to the output of the loop filter, a second input for receiving a clamping signal, and an output, and
a voltage-controlled oscillator having an input connected to the output of the clamp circuit and an output connected to the output terminal and the other input of the phase detector;
said clamping circuit including:
a bypass circuit for connecting the output of the loop filter to the input of the voltage-controlled oscillator,
resistor-capacitor time constant means for providing a time constant varying potential,
first clamping means for clamping the input of the voltage-controlled oscillator to the time constant varying potential, and
control means, responsive to a clamping signal for selectively disabling the bypass circuit and enabling the first clamping means and whereby the resistor capacitor time constant means slew-rate controls the potential applied to the voltage-controlled oscillator.

10. A clock circuit as claimed in claim 9 further comprising a second clamping means for clamping the output of the loop filter to a reference potential.

11. A clock circuit as claimed in claim 10 wherein the control means comprise first and second comparators, each having one input connected to a reference potential and the other input connected to the second input of the clamping circuit, and an analog multiplexer, having an input connected to the second input of the clamping circuit.

12. A clock circuit as claimed in claim 11 wherein first and second comparators have outputs connected to first and second clamping means and the bypass circuit for enabling first and second clamping means and for disabling the bypass circuit, respectively, in response to the clamping signal.

13. A clock circuit as claimed in claim 12 wherein the resistor-capacitor time constant means comprises a capacitor and a voltage follower connected to the first clamping means and a resistor selectively connected between the capacitor and ground via the analog multiplexer, for providing a time constant varying potential thereto.

14. A clock circuit as claimed in claim 13 wherein the first clamping means includes a diode network having two parallel branches of two series-connected diodes, having the output of the voltage follower connected to one branch between the diodes, and the input to the voltage-controlled oscillator connected to the other branch between the diodes.

15. A clock circuit as claimed in claim 14 wherein the second clamping means includes a diode network having two parallel branches of two series-connected diodes, having the output of the loop filter connected to one branch between the diodes, and the reference potential to the other branch between the diodes.

16. A clock circuit as claimed in claim 15 wherein the bypass circuit means includes a field-effect transistor having gate, drain and source inputs, a diode connected between the output of the first comparator and the gate input, and a biassing resistor connected between gate and source inputs of the field-effect transistor.

* * * * *